(12) United States Patent
Matsunaga

(10) Patent No.: US 7,645,631 B2
(45) Date of Patent: Jan. 12, 2010

(54) METHOD OF MANUFACTURING ORGANIC EL DISPLAY

(75) Inventor: Ikuo Matsunaga, Ishikawa-gun (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 707 days.

(21) Appl. No.: 11/189,748

(22) Filed: Jul. 27, 2005

(65) Prior Publication Data
US 2005/0269962 A1    Dec. 8, 2005

Related U.S. Application Data

(63) Continuation of application No. PCT/JP2004/000648, filed on Jan. 26, 2004.

(30) Foreign Application Priority Data
Jan. 27, 2003    (JP)    ............................. 2003-017189

(51) Int. Cl.
    *H01L 51/40*    (2006.01)
(52) U.S. Cl. ............................ 438/99; 257/40; 257/59; 257/72; 438/149
(58) Field of Classification Search ................ 438/99
    See application file for complete search history.

(56) References Cited

U.S. PATENT DOCUMENTS

| 6,246,179 | B1 * | 6/2001 | Yamada | .................... 315/169.3 |
| 6,580,094 | B1 * | 6/2003 | Yamazaki et al. | .............. 257/79 |
| 2002/0136823 | A1 * | 9/2002 | Miyashita et al. | ............. 427/66 |
| 2004/0201048 | A1 * | 10/2004 | Seki et al. | .................... 257/294 |

FOREIGN PATENT DOCUMENTS

| EP | 0 989 778 A1 | 3/2000 |
| EP | 1 006 587 A2 | 6/2000 |
| EP | 1 096 571 A2 | 5/2001 |
| JP | 58-23017 | 2/1983 |
| JP | 58-171845 | 10/1983 |
| JP | 63-155125 | 6/1988 |
| JP | 63-205638 | 8/1988 |

(Continued)

OTHER PUBLICATIONS

English Abstract of JP 02-118523.*

(Continued)

*Primary Examiner*—Kenneth A Parker
*Assistant Examiner*—Anthony Ho
(74) *Attorney, Agent, or Firm*—Oblon, Spivak, McClelland, Maier & Neustadt, L.L.P.

(57) ABSTRACT

There is provided a method of manufacturing an organic EL display including an insulating substrate, a power supply terminal, a plurality of pixels arrayed on the substrate and each including an organic EL element and a pixel circuit, and an organic planarizing film covering the pixel circuits and interposed between the organic EL elements and the substrate, including selecting a pixel which can be recognized as a dark spot and/or a bright spot from the pixels, and irradiating, of the pixel circuit included in the selected pixel, a portion located between the organic planarizing film and the substrate with an energy beam through the substrate to electrically disconnect the organic EL element included in the selected pixel from the power supply terminal.

19 Claims, 7 Drawing Sheets

FOREIGN PATENT DOCUMENTS

| | | |
|---|---|---|
| JP | 2-64526 | 3/1990 |
| JP | 2-118523 | 5/1990 |
| JP | 4-331922 | 11/1992 |
| JP | 2000-181366 | 6/2000 |
| JP | 2000-353594 | 12/2000 |
| JP | 2001-159872 | 6/2001 |
| JP | 2001-175200 | 6/2001 |
| JP | 2001-195016 | 7/2001 |
| JP | 2003-217827 | 7/2003 |
| JP | 2003-233329 | 8/2003 |
| JP | 2003-288986 | 10/2003 |
| JP | 2004-6339 | 1/2004 |

OTHER PUBLICATIONS

Machine Translation of JP 2000-181366.*

* cited by examiner

METHOD OF MANUFACTURING ORGANIC EL DISPLAY

CROSS REFERENCE TO RELATED APPLICATIONS

This is a Continuation Application of PCT Application No. PCT/JP2004/000648, filed Jan. 26, 2004, which was published under PCT Article 21(2) in Japanese.

This application is based upon and claims the benefit of priority from prior Japanese Patent Application No. 2003-017189, filed Jan. 27, 2003, the entire contents of which are incorporated herein by reference.

BACKGROUND OF THE INVENTION

1. Field of the Invention

The present invention relates to a method of manufacturing an organic EL (Electroluminescent) display.

2. Description of the Related Art

In recent years, displays using organic EL elements have been developed. In an organic EL element, a light-emitting layer is sandwiched between a pair of electrodes. The organic EL element emits light at a luminance corresponding to a driving current which flows between the electrodes.

In the manufacturing process of an organic EL display, when a low-molecular organic substance is used as a material of a light-emitting layer, vacuum deposition is used to form the light-emitting layer. Alternatively, when a polymeric organic substance is used as a material of a light-emitting layer, a method is employed in which a film is formed by applying a solution containing a polymeric organic substance and dried.

In either case, an anode and a cathode may short-circuit due to partial absence in a light-emitting layer. As a result, the organic EL element is recognized as a dark spot. Even without any short circuit between an anode and a cathode, if the characteristic of an organic EL element deviates from those of other organic EL elements, the former organic EL element is recognized as a dark spot or a bright spot.

Such a luminance shift can also occur due to another factor when active matrix driving is executed by arranging a drive transistor for each pixel. For example, if the characteristic of the drive transistor for a pixel deviates from those of the drive transistors for other pixels, the former pixel is recognized as a dark spot or a bright spot.

Of the above-described luminance shifts, the dark spot is difficult to be recognized as compared to the bright spot. The bright spot can be made more unnoticeable by changing it to a dark spot. This can be done by, e.g., fusing the interconnection which connects the drain of the drive transistor included in the bright spot pixel to the anode of the organic EL element by irradiating the interconnection with the second harmonic of a YAG laser.

For the dark spot generated by the short circuit between the anode and the cathode, it is effective to employ a structure in which the each anode is constituted by a plurality of conductive layers spaced apart from each other and the conductive layers are connected to the drain of the drive transistor through interconnections, respectively. More specifically, according to this structure, when disconnecting only the interconnection, which connects the conductive layer short-circuited with the cathode to the drain of the drive transistor, by fusion using laser beam irradiation, the conductive layer short-circuited with the cathode can be insulated from the remaining conductive layers included in the same pixel. Hence, the pixel can be suppressed from being recognized as a dark spot.

The cathode is formed as a common electrode. For this reason, it cannot be confirmed by using transmitted illumination whether the interconnection has been disconnected by fusion using laser beam irradiation. To confirm it, reflected illumination is used. However, it is difficult to distinguish reflection by the interconnection surface made of a metal from that by the cathode surface.

To disconnect a metal by fusion, very large energy is necessary because of its high reflectance, or viscosity or fluidity in a melted state. Hence, when the interconnection is disconnected by fusion using laser beam irradiation, its peripheral portion is readily damaged. For example, the insulating layer between the interconnection and the cathode may break so that they may short-circuit. Alternatively, an interconnection which should not be disconnected may also be disconnected by fusion.

BRIEF SUMMARY OF THE INVENTION

It is an object of the present invention to provide a technique for disconnecting the organic EL element of a bright spot or a dark spot from the current path without undesirably damaging the constituent elements of an organic EL display.

According to a first aspect of the present invention, there is provided a method of manufacturing an organic EL display comprising an insulating substrate with light transmittance properties, a power supply terminal, a plurality of pixels arrayed in a matrix on the insulating substrate and each including an organic EL element and a pixel circuit which controls power supply from the power supply terminal to the organic EL element, and an organic planarizing film covering the pixel circuits and interposed between the organic EL elements and the insulating substrate, comprising selecting a pixel which can be recognized as a dark spot and/or a bright spot from the pixels, and irradiating, of the pixel circuit included in the selected pixel, a portion located between the organic planarizing film and the insulating substrate with an energy beam through the insulating substrate to electrically disconnect the organic EL element included in the selected pixel from the power supply terminal.

According to a second aspect of the present invention, there is provided a method of manufacturing an organic EL display comprising an insulating substrate with light transmittance properties, a power supply terminal, a plurality of pixels arrayed in a matrix on the insulating substrate and each including an organic EL element and a pixel circuit which controls power supply from the power supply terminal to the organic EL element, and a partition insulating layer covering at least part of the pixel circuit and surrounding the organic EL element, the partition insulating layer including an organic insulating layer, comprising selecting a pixel which can be recognized as a dark spot and/or a bright spot from the pixels, and irradiating, of the pixel circuit included in the selected pixel, a portion located between the organic insulating layer and the insulating substrate with an energy beam through the insulating substrate to electrically disconnect the organic EL element included in the selected pixel from the power supply terminal.

According to a third aspect of the present invention, there is provided a method of manufacturing an organic EL display comprising an insulating substrate with light transmittance properties, a power supply terminal, and a plurality of pixels arrayed in a matrix on the insulating substrate and each including an organic EL element and a pixel circuit which controls power supply from the power supply terminal to the organic EL element, comprising selecting a pixel which can be recognized as a dark spot and/or a bright spot from the pixels; and irradiating part of the pixel circuit included in the selected pixel with an energy beam through the insulating substrate to electrically disconnect the organic EL element included in the selected pixel from the power supply terminal, wherein the energy beam irradiation is carried out such that a volume V ($\mu m^3$) of the portion of the pixel circuit which is irradiated with the energy beam, and an energy R (mJ) of the energy beam with which the portion is irradiated satisfy a relationship given by an inequality: $0.067 \times V < R < 0.17 \times V$.

DETAILED DESCRIPTION OF THE INVENTION

Figure 1:
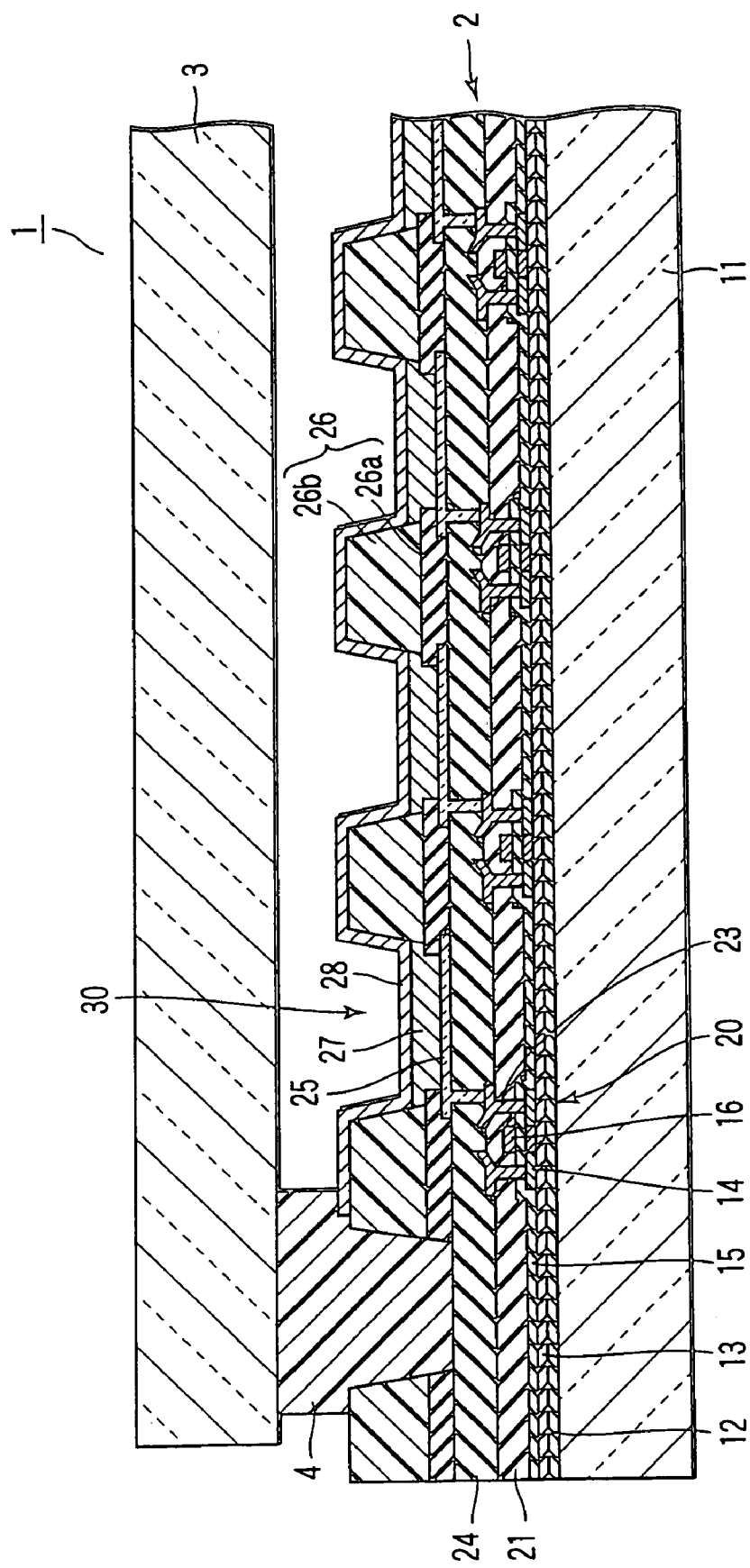
FIG. 1 is a sectional view schematically showing an example of an organic EL display which can be manufactured by a method according to the first embodiment of the present invention.

Several embodiments of the present invention will be described below in detail with reference to the accompanying drawings. The same reference numerals denote the same or similar constituent elements throughout the drawings, and a repetitive description thereof will be omitted.

FIG. 1 is a sectional view schematically showing an example of an organic EL display which can be manufactured by a method according to the first embodiment of the present invention. An organic EL display 1 shown in FIG. 1 includes an array substrate 2 and a sealing substrate 3 facing each other, and a seal layer 4 interposed therebetween. The seal layer 4 is formed along the periphery of the sealing substrate 3. Accordingly, an enclosed space is formed between the array substrate 2 and the sealing substrate 3. For example, this space is filled with a rare gas such as Ar gas or an inert gas such as $N_2$ gas.

The array substrate 2 has an insulating substrate 11 with light transmission properties such as a glass plate. For example, an $SiN_X$ layer 12 and an $SiO_2$ layer 13 are sequentially formed on the substrate 11 as an undercoat layer. Semiconductor layers 14 such as polysilicon layers each having a channel, source, and drain, a gate insulator 15, and gate electrodes 16 are sequentially formed on the undercoat layer. These components form top-gate type thin-film transistors (TFTs) 20.

An interlayer insulator 21 made of, e.g., $SiO_2$ is formed on the gate insulator 15 and gate electrodes 16. Power supply lines (not shown) and source and drain electrodes 23 are formed on the interlayer insulator 21. These components are buried by a passivation film 24 made of, e.g., $SiN_X$. The source and drain electrodes 23 are electrically connected to the sources and drains of the TFTs 20 through contact holes formed in the interlayer insulator 21.

A plurality of anodes 25 are juxtaposed on the passivation film 24 while being spaced from one another. In this example, each anode 25 includes a conductive film with light transmission properties such as ITO. Each anode 25 is electrically connected to a corresponding drain electrode 23.

An insulating layer 26a is formed on the passivation film 24. The insulating layer 26a is, e.g., an inorganic insulating layer having affinity for liquid. The insulating layer 26a has through holes at positions corresponding to the anodes 25 and covers the exposed portions of the passivation film 24 between the anodes 25 and the peripheral portions of the anodes 25.

An insulating layer 26b is formed on the insulating layer 26a. The insulating layer 26b is, e.g., a liquid-repellent organic layer. The insulating layer 26b has, at positions corresponding to the anodes 25, through holes having a diameter equal to or larger than that of the through holes in the insulating layer 26a.

The layered structure of the insulating layers 26a and 26b forms a partition insulating layer 26 having through holes at positions corresponding to the anodes 25. The partition insulating layer 26 may include either the layered structure of the insulating layers 26a and 26b or only the insulating layer 26b.

Organic layers 27 each including a light-emitting layer are formed on the anodes 25 exposed in the through holes of the partition insulating layer 26. Each light-emitting layer is, e.g., a thin film containing luminescent organic compound which emits red, green, or blue light. In addition to the light-emitting layer, each organic layer 27 can also include, e.g., a buffer layer which mediates hole injection from the anode 25 to the light-emitting layer.

A common electrode (cathode) 28 is formed on the partition insulating layer 26 and organic layers 27. The cathode 28 is electrically connected to power supply lines through contact holes (not shown) formed in the passivation film 24 and partition insulating layer 26. Each organic EL element 30 includes the anode 25, organic layer 27, and cathode 28.

Figure 2:
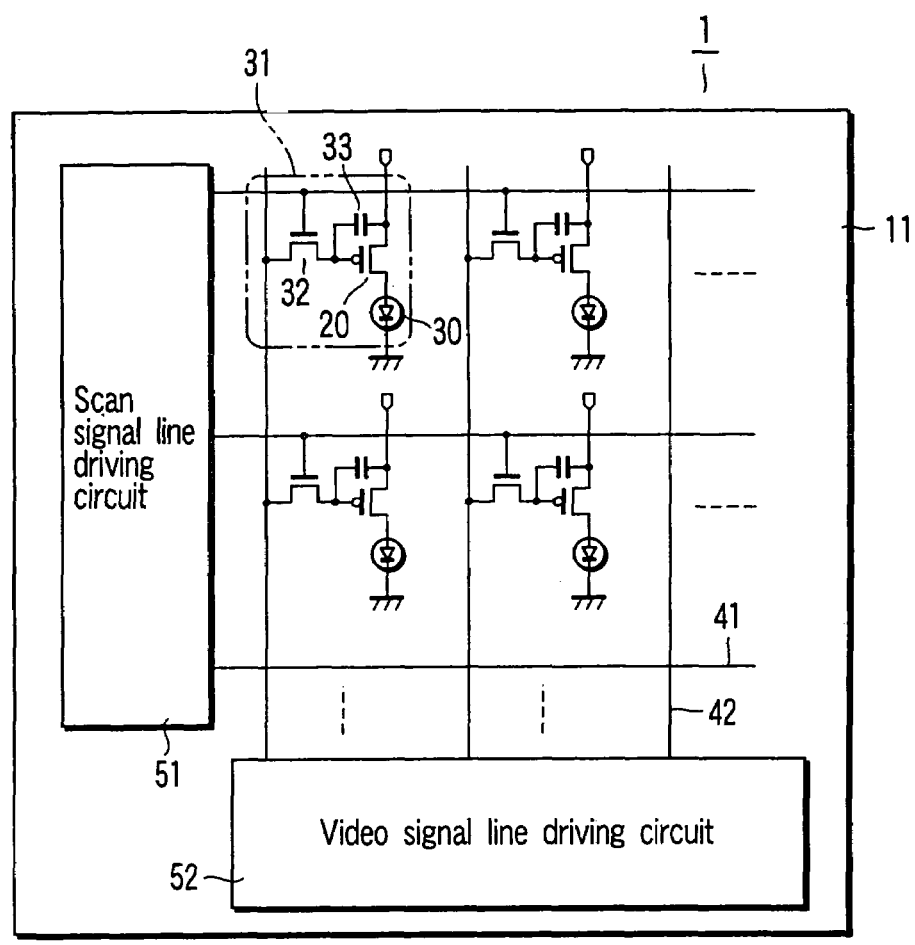
FIG. 2 is a plan view schematically showing an example of a circuit arrangement which can be employed by the organic EL display shown in FIG. 1.

FIG. 2 is a plan view schematically showing an example of a circuit arrangement which can be employed by the organic EL display 1 shown in FIG. 1. As shown in FIG. 2, the organic EL display 1 includes scan signal lines 41 and video signal lines 42, which are laid out in a matrix on the substrate 11.

Pixels 31 are arranged near the intersections between the scan signal lines 41 and video signal lines 42.

The scan signal lines 41 run in the row direction of the pixels and are arrayed in the column direction. The scan signal lines 41 are connected to a scan signal line driver 51. On the other hand, the video signal lines 42 run in the column direction of the pixels and are arrayed in the row direction. The video signal lines 42 are connected to a video signal line driver 52.

Each pixel 31 includes the drive transistor 20 serving as a drive control element, the organic EL element 30, a selection transistor 32 serving as a selector switch, and a capacitor 33. In this example, the drive transistor 20 is a p-channel TFT, and the selection transistor 32 is an n-channel TFT.

The drive transistor 20 and organic EL element 30 are connected in series between a pair of voltage source terminals. The capacitor 33 is connected between the gate of the drive transistor 20 and a constant potential terminal, and in this example, the first power supply terminal. The selection transistor 32 is connected between the video signal line 42 and the gate of the drive transistor 20. The gate of the selection transistor 32 is connected to the scan signal line 41.

The drive transistor 20, selection transistor 32, capacitor 33, and an interconnection which connects them form a pixel circuit. The pixel circuit controls the magnitude of a current from the first power supply terminal to the organic EL element 30 on the basis of a scan signal supplied from the scan signal line driving circuit 51 through the scan signal line 41 and a video signal supplied from the video signal line driving circuit 52 through the video signal line 42.

In this embodiment, when a certain pixel 31 is recognized as a bright spot, of the polysilicon portion of the pixel circuit included in the pixel 31, a portion located between the insulating layer 26b and the insulating substrate 11 is irradiated with an energy beam from the side of the substrate 11, as will be described below. Accordingly, the organic EL element 30 is electrically disconnected from the first power supply terminal so that the pixel 31 can hardly be recognized as a bright spot.

Figure 3:
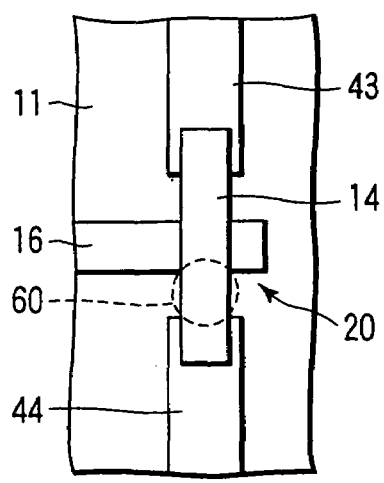
FIG. 3 is a plan view schematically showing an example of a repair method according to the first embodiment of the present invention.
Figure 4:
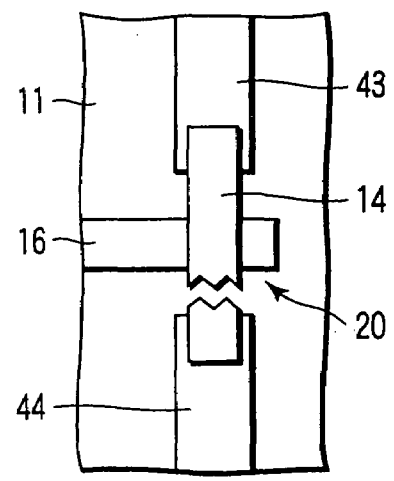
FIG. 4 is a plan view schematically showing an example of a repair method according to the first embodiment of the present invention.

FIGS. 3 and 4 are plan views schematically showing an example of a repair method according to the first embodiment of the present invention. FIGS. 3 and 4 show the drive transistor 20 which can be observed when the organic EL display 1 shown in FIG. 1 is viewed from the side of the substrate 11. Referring to FIGS. 3 and 4, reference numeral 43 denotes an interconnection (e.g., the source electrode 23) which connects the power supply to the source of the drive transistor 20, reference numeral 44 denotes an interconnection (e.g., the drain electrode 23) which connects the drain of the drive transistor 20 to the anode 25 of the organic EL element 30 and reference numeral 60 denotes a beam spot of a laser beam.

In this method, when a certain pixel 31 is recognized as a bright spot or a dark spot, of the polysilicon portion of the pixel circuit included in the pixel 31, a portion located between the insulating layer 26b and the insulating substrate 11 is irradiated with-an energy beam such as the second harmonic of a YAG laser from the side of the substrate 11. Accordingly, the polysilicon layer 14 is divided, as shown in FIG. 4.

When the polysilicon layer 14 is divided, no power is supplied to the organic EL element 30 of the pixel 31. When the pixel 31 is recognized as a bright spot, it can be made visible as a dark spot, i.e., unnoticeable as a bright spot by dividing the polysilicon layer 14. When the pixel 31 is recognized as a dark spot, power consumption by the pixel 31 which does not contribute to display can be reduced by dividing the polysilicon layer 14.

The polysilicon layer 14 absorbs the laser beam at a much higher efficiency than a metal interconnection. For this reason, the polysilicon layer 14 can be divided by laser beam irradiation of relatively low energy as compared to disconnection of metal interconnection by fusion using laser beam irradiation.

In this example, the polysilicon layer 14 of the drive transistor 20 is located between the insulating layer 26b and the insulating substrate 11. Many of organic insulating materials used for the insulating layer 26b absorb the laser beam used to divide the polysilicon layer 14 at a higher efficiency than inorganic insulating materials with light transmittance properties. The insulating layer 26b is a relatively thick layer having a thickness of about 2 μm to 3 μm and does not contribute to display. The organic layer 27 and cathode 28 which are readily damaged by laser beam irradiation are not present between the substrate 11 and the insulating layer 26b.

Hence, according to this method, when the pixel 31 generates a bright spot or dark spot, and the organic EL element is to be disconnected from the current path by laser beam irradiation, the peripheral portion of the laser beam irradiation portion can be prevented from being damaged.

Normally, the reflectance to visible light is much lower in the polysilicon layer 14 than in the cathode 28. Hence, it can be confirmed by using reflected illumination whether the polysilicon layer 14 has been divided by laser beam irradiation.

The polysilicon layer 14 is preferably completely divided by laser beam irradiation. However, it need not always be completely divided. This is because when the polysilicon layer 14 is irradiated with a laser beam, at least part of the irradiated portion can be changed to amorphous. More specifically, the resistivity of amorphous silicon is higher than that of polysilicon. Even when the polysilicon layer 14 is not physically completely divided by laser beam irradiation, the power can hardly be supplied to the organic EL element 30 of the pixel 31. Hence, almost the same effect as described can be obtained although the effect is not so large as when the polysilicon layer 14 is completely divided.

In the above-described method, a bright spot or a dark spot can be detected by, e.g., observing the display surface while driving all the pixels 31 under the same conditions. The result that the bright spot pixel is made noticeable by the above-described process can also be confirmed by, e.g., observing the display surface while driving all the pixels 31 under the same conditions.

The disconnection processing can be executed any time after the pixels 31 are completed. For example, the disconnection processing may be executed when the array substrate 2 shown in FIG. 1 is completed or for the organic EL display 1 in the state shown in FIG. 1. Alternatively, the disconnection processing may be executed after a polarizing film for preventing reflection of external light is bonded to the outer surface of the substrate 11. As described above, according to this method, the organic EL element of the pixel 31 can be disconnected by laser beam irradiation at relatively low energy. For this reason, even when the disconnection processing is executed after the polarizing film for preventing reflection of external light is bonded to the outer surface of the substrate 11, the polarizing film is rarely damaged.

In the above-described example, the polysilicon layer 14 of the drive transistor 20 is irradiated with a laser beam in the disconnection processing. Alternatively, the polysilicon layer 14 of the selection transistor 32 may be irradiated with a laser beam. However, normally, a bright spot can more reliably be made unnoticeable in the former case than in the latter case.

In the above-described example, the circuit arrangement shown in FIG. 2 is employed. However, another circuit arrangement may be employed. In this case, laser beam irradiation can be executed for either transistor if power supply to the organic EL element 30 can be reduced.

In the example described with reference to FIGS. 3 and 4, the semiconductor layer of the transistor included in the pixel circuit is used as the polysilicon portion to be irradiated with the laser beam. The polysilicon portion to be irradiated with the laser beam is not limited to the semiconductor layer of the transistor and can be an interconnection included in the pixel circuit.

For example, at least one of interconnections which connect a plurality of electrical elements included in the pixel circuit to one another and/or interconnections which connect these electrical elements to the organic EL element 30, scan signal line 41, video signal line 42, and a power supply line (not shown) may include a polysilicon portion. For example, at least one of these interconnections may include a metal portion and polysilicon portion which are connected in series. When laser beam irradiation is executed for the polysilicon portion, the above-described repair processing can also be executed, as will be described later.

Figure 5:
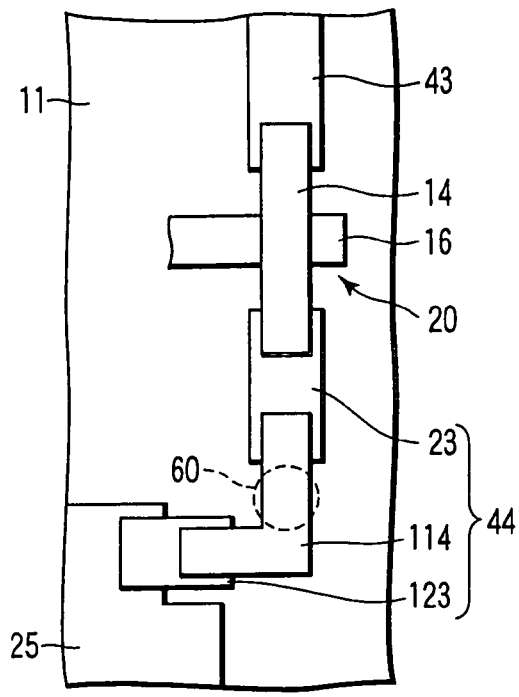
FIG. 5 is a plan view schematically showing another example of the repair method according to the first embodiment of the present invention.
Figure 6:
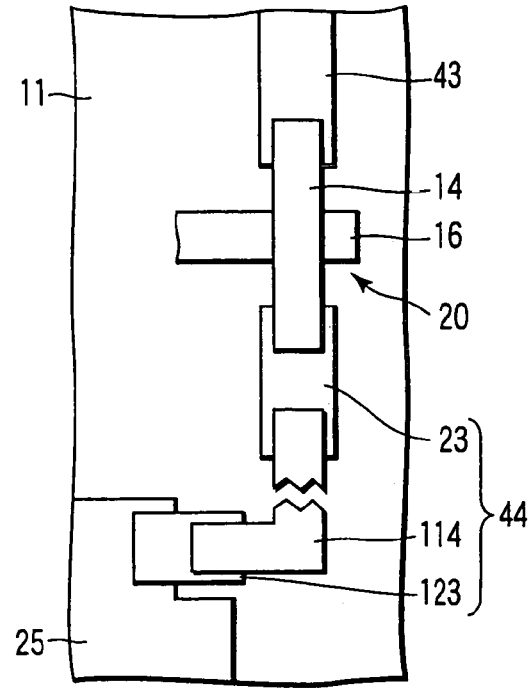
FIG. 6 is a plan view schematically showing another example of the repair method according to the first embodiment of the present invention.

FIGS. 5 and 6 are plan views schematically showing another example of the repair method according to the first embodiment of the present invention. FIGS. 5 and 6 show a structure which can be observed when the organic EL display 1 shown in FIG. 1 is viewed from the side of the substrate 11.

In the structure shown in FIGS. 5 and 6, the interconnection 44 includes the metal portion (drain electrode) 23, a polysilicon portion 114 to which conductivity is imparted by heavily doping an impurity, and a metal portion 123. The polysilicon portion 114 is located between the insulating layer 26b and the insulating substrate 11.

When a certain pixel 31 is recognized as a bright spot or a dark spot in the organic EL display 1 which employs the above structure, the polysilicon portion 114 corresponding to the pixel 31 may be irradiated with an energy beam such as the second harmonic of a YAG laser from the side of the substrate 11, for example, as shown in FIG. 5. In this case, as shown in FIG. 6, the interconnection 44 can be divided at the position of the polysilicon portion 114, or at least part of the polysilicon portion 114 can be changed to amorphous. Accordingly, power supply to the organic EL element 30 of the pixel 31 can be reduced. Even with this method, the same effect as described with reference to FIGS. 3 and 4 can be obtained.

When the structure shown in FIGS. 5 and 6 is employed, the metal portions 23 and 123 may be formed by the same process. In addition, the polysilicon portion 114 and the source and drain of the polysilicon layer 14 may be formed by the same process.

When the following structure is employed for a pixel, and the method described with reference to FIGS. 5 and 6 is used for the disconnection processing, a bright spot pixel or a dark spot pixel can be repaired by separating a portion of the organic EL element in the pixel from the remaining portion of the organic EL element and operating the remaining portion.

Figure 7:
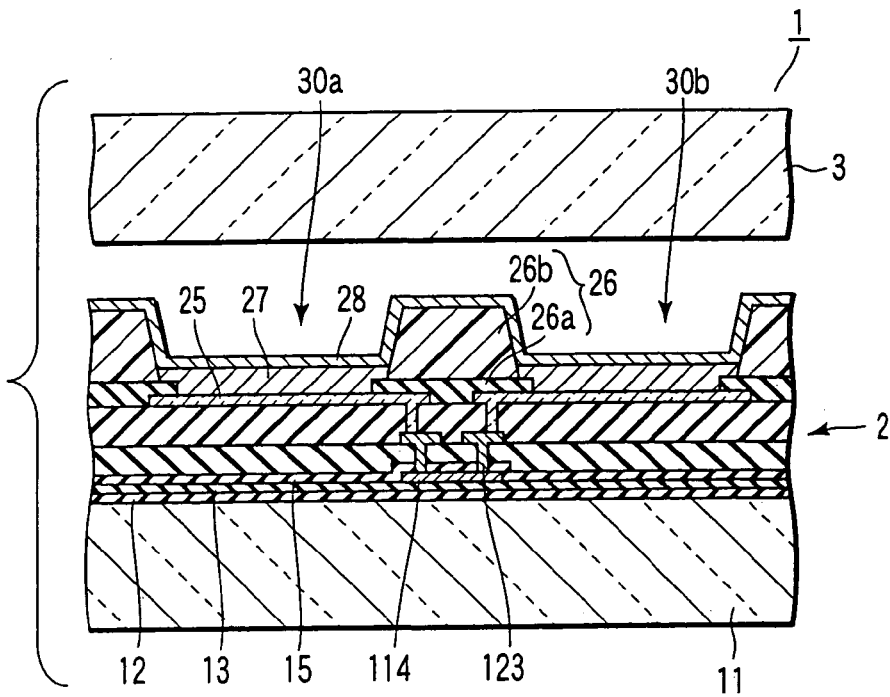
FIG. 7 is a sectional view schematically showing another example of the organic EL display which can be manufactured by the method according to the first embodiment of the present invention.
Figure 8:
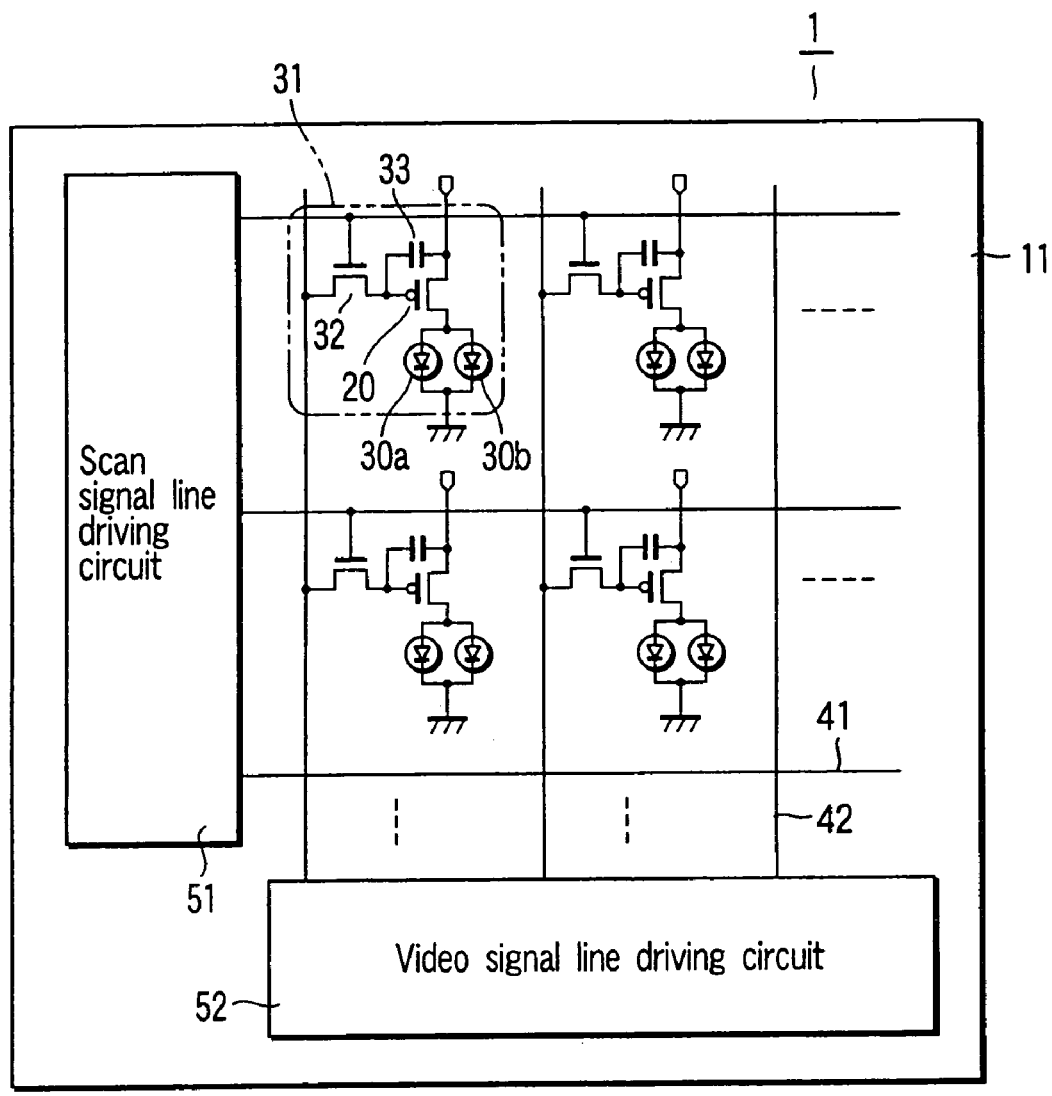
FIG. 8 is a plan view schematically showing an example of a circuit arrangement which can be employed by the organic EL display shown in FIG. 7.

FIG. 7 is a sectional view schematically showing another example of the organic EL display which can be manufactured by the method according to the first embodiment of the present invention. FIG. 8 is a plan view schematically showing an example of a circuit arrangement which can be employed by the organic EL display shown in FIG. 7.

In the example shown in FIGS. 7 and 8, each pixel 31 includes a plurality of organic EL elements (in this example, two organic EL elements 30a and 30b) which are connected in parallel between the drive transistor 20 and the second power supply (in this example, GND). Assume that this structure is employed, and a certain pixel 31 is recognized as a bright spot or a dark spot. Even in this case, if only one of the organic EL elements 30a and 30b included in the pixel 31 causes the defect, the pixel 31 can be operated as a normal pixel by disconnecting only the organic EL element from the drive transistor 20, as will be described below.

Figure 9:
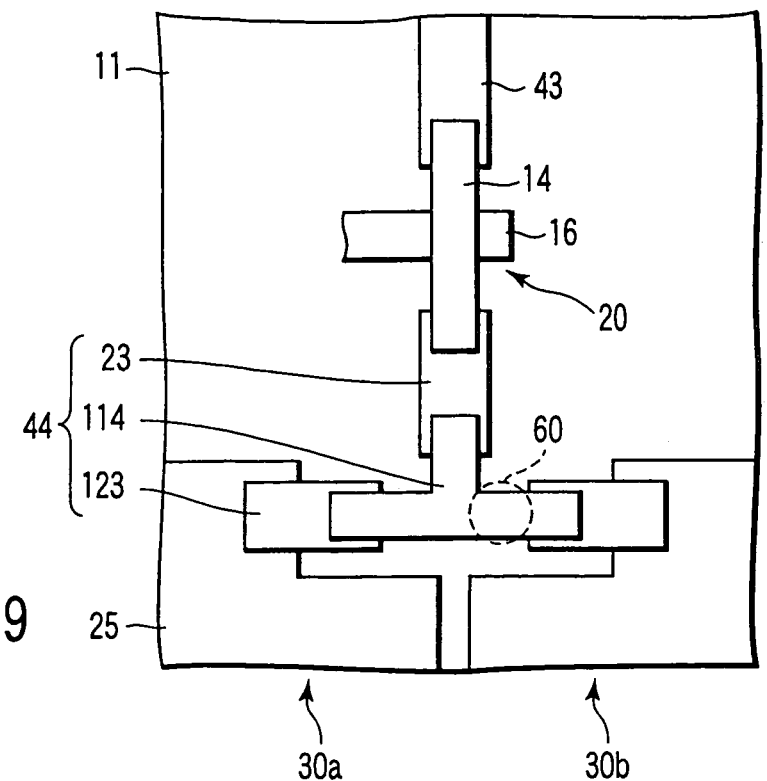
FIG. 9 is a plan view schematically showing still another example of the repair method according to the first embodiment of the present invention.
Figure 10:
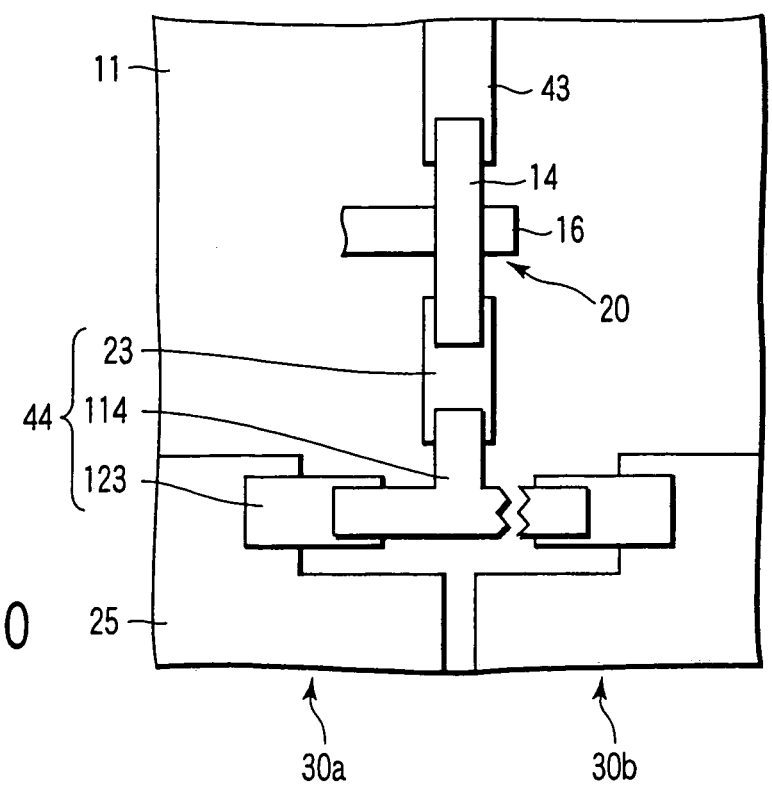
FIG. 10 is a plan view schematically showing still another example of the repair method according to the first embodiment of the present invention.

FIGS. 9 and 10 are plan views schematically showing still another example of the repair method according to the first embodiment of the present invention. FIGS. 9 and 10 show a structure which can be observed when the organic EL display 1 shown in FIGS. 7 and 8 is viewed from the side of the substrate 11.

In the structure shown in FIGS. 9 and 10, the interconnection 44 includes the metal portion (drain electrode) 23, the polysilicon portion 114 to which conductivity is imparted by doping an impurity, and the metal portion 123. The polysilicon portion 114 branches on the sides of two anodes 25 corresponding to the organic EL elements 30a and 30b. The anodes 25 are connected in parallel between the GND and the drain of the drive transistor 20. The polysilicon portion 114 is located between the insulating layer 26b and the insulating substrate 11.

When a certain pixel 31 in the organic EL display 1 which employs this structure is recognized as a bright spot or a dark spot due to, for example, the organic EL element 30b, the polysilicon portion 114 included in the pixel 31 is irradiated with an energy beam such as the second harmonic of a YAG laser from the side of the substrate 11 at a position between the branch point and the anode 25 as shown in FIG. 9. In this case, the polysilicon portion 114 is divided at the position between the branch point and the anode 25 as shown in FIG. 10, or at least part of the portion located between the branch point and the anode 25 is changed to amorphous. Accordingly, only the organic EL element 30b can be disconnected from the current path between the first power supply terminal and the second power supply terminal. Hence, power supply to the organic EL element 30b included in the pixel 31 can be reduced.

According to this method, the same effect as described with reference to FIGS. 3 and 4 can be obtained. In addition, in this method, even when power supply to the organic EL element 30b included in the pixel 31 which is recognized as a bright spot is reduced by the repair processing, power supply to the organic EL element 30a included in the pixel 31 is maintained. For this reason, according to this method, the bright spot can be made unnoticeable, and at the same time, normal operation can be executed. Even when the pixel 31 is recognized as a dark spot, unnecessary power supply can be suppressed, and the normal organic EL element 30a can be operated by employing the same method as described above.

In the method described with reference to FIGS. 9 and 10, the following method can be utilized in order to determine whether only the organic EL element 30a makes the pixel 31 recognizable as a bright spot or a dark spot, only the organic EL element 30b makes the pixel 31 recognizable as a bright spot or a dark spot, or both the organic EL elements 30a and 30b make the pixel 31 recognizable as a bright spot or a dark spot. First, the display surface is observed while driving all pixels under the same conditions, thereby specifying the pixel 31 which generates a bright spot or a dark spot. Next, the specified pixel 31 is observed with a microscope or the like to specify the organic EL element 30a or 30b having a foreign substance or an abnormal portion. The organic EL element 30a or 30b specified by this method is electrically insulated from the power supply by the above-described processing. Accordingly, most bright spot pixels or dark spot pixels can be made unnoticeable and operated as normal pixels. When the display surface is observed again after the repair processing while driving all the pixels 31 under the same conditions, the organic EL element 30a or 30b which contains a defect to be repaired but could not be detected by observation with the microscope can easily be detected. The organic EL element 30a or 30b detected at this time can also be electrically insulated from the power supply by executing the above-described repair processing.

When the structure shown in FIG. 9 is employed for the pixel 31, the metal portions 23 and 123 may be formed by the same process. In addition, the polysilicon portion 114 and the source and drain of the polysilicon layer 14 may be formed by the same process.

The second embodiment of the present invention will be described next. In the first embodiment, the pixel 31 which generates a bright spot or a dark spot is processed by executing laser beam irradiation for a constituent element made of a semiconductor such as polysilicon. In the second embodiment, laser beam irradiation to repair a pixel 31 which generates a bright spot or a dark spot is executed for a portion located between an insulating layer 26b of the pixel circuit and an insulating substrate 11, as in the first embodiment. In the second embodiment, however, the size of the portion of the pixel circuit, which is to be irradiated with the laser beam, and the size of the beam spot formed by the laser beam at that position are made equal to each other. Accordingly, in the second embodiment, metal materials can also be used as the material of the constituent element to be irradiated with the laser beam, in addition to semiconductors such as polysilicon.

Figure 11:
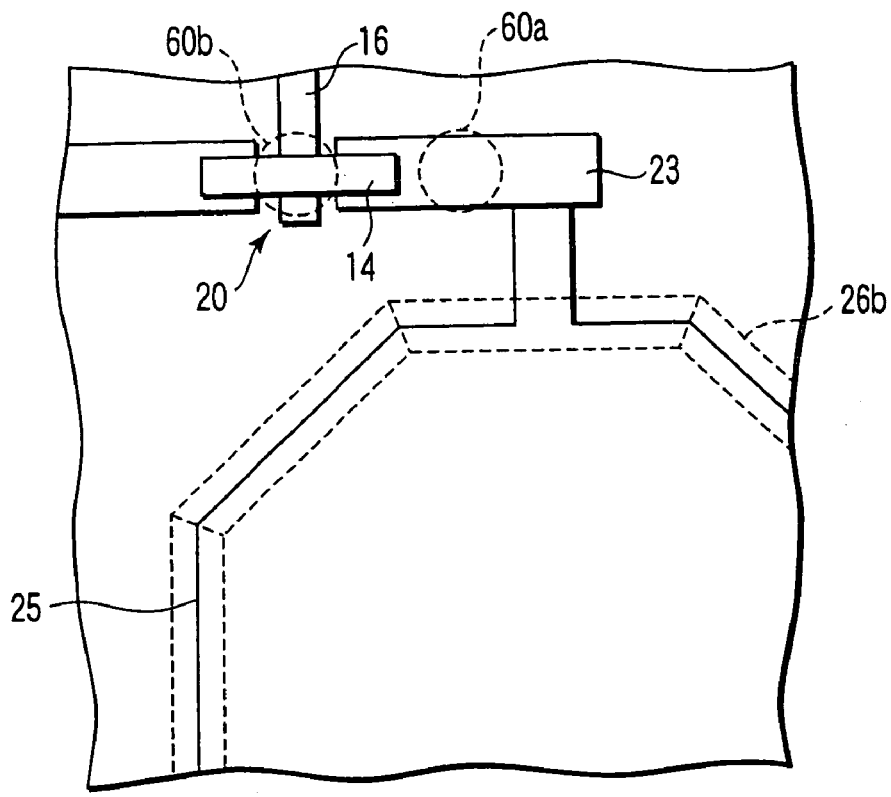
FIG. 11 is a plan view schematically showing an example of a repair method according to the second embodiment of the present invention.

FIG. 11 is a plan view schematically showing an example of a repair method according to the second embodiment of the present invention. FIG. 11 shows a structure which can be observed when an organic EL display 1 having almost the same structure as shown in FIG. 1 is viewed from the side of the substrate 11. Referring to FIG. 11, reference numerals 60a and 60b denote positions of the beam spot of a laser beam.

In the structure shown in FIG. 11, the insulating layer 26b included in the partition insulating layer 26 has a through hole having a shape conforming to an anode 25 and, in this example, an almost regular octagonal shape. The insulating layer 26b is made of an organic insulating material and covers the pixel circuit including a drive transistor 20 and the like.

In the second embodiment, laser beam irradiation to disconnect the organic EL element which generates a bright spot or a dark spot is executed for a portion located between the insulating layer 26b of the pixel circuit and the insulating substrate 11, as in the first embodiment. For example, as shown in FIG. 11, laser beam irradiation is executed to form a beam spot at the position 60a or 60b.

Many of organic insulating materials such as acrylic resin represented by, e.g., HRC (Hard Resin Coat) used for the insulating layer 26b absorb a laser beam used to divide a semiconductor layer such as a polysilicon layer 14 or a laser beam used to disconnect a metal layer such as source and drain electrodes 23 by fusion at a higher efficiency than inorganic insulating materials with light transmittance properties. To divide the semiconductor layer, convert it to amorphous, or disconnect it by fusion, for example, the second harmonic of a YAG laser can be used.

The insulating layer 26b is a relatively thick layer and does not contribute to display. Neither organic layer 27 nor cathode 28 which are readily damaged by laser beam irradiation are present between the substrate 11 and the insulating layer 26b.

Hence, when a metal layer is to be disconnected by fusion, the peripheral portion can be suppressed from being damaged by executing laser beam irradiation in the following way. An example will be described in which the drain electrode 23 is disconnected at the position 60a by fusion.

If the size of the beam spot formed by the laser beam at a position on the surface of the drain electrode 23 is larger than the width of the drain electrode 23, the laser beam partially becomes incident on the insulating layer 26b during the period after laser beam irradiation is started until the drain electrode 23 is disconnected by fusion. Since the drain electrode 23 is made of a metal material, relatively large energy is required to disconnect it. For this reason, the cathode 28 and drain electrode 23 may short-circuit or the cathode 28 may break due to the break of the insulating layer 26b. For example, if the cathode 28 partially breaks, water may enter the organic layer 27 from the broken portion through the insulating layer 26b.

Conversely, if the size of the beam spot formed by the laser beam at a position on the surface of the drain electrode 23 equals the width of the drain electrode 23, the laser beam does not become incident on the insulating layer 26b during the period after laser beam irradiation is started until the drain electrode 23 is disconnected by fusion. That is, in this case, the laser beam becomes incident on the insulating layer 26b only after the drain electrode 23 is disconnected by fusion. After the drain electrode 23 is disconnected by fusion, laser beam irradiation is immediately stopped. Then, the insulating layer 26b can absorb the laser beam without breaking. In other words, the insulating layer 26b can be prevented from breaking, and the laser beam can be suppressed from reaching the cathode 28. Hence, short circuit between the drain electrode 23 and the cathode 28 or breaking of the cathode 28 can be prevented.

When laser beam irradiation to reduce power supply to an organic EL element 30 is executed not for the metal layer but for the semiconductor layer, various kinds of control can easily be executed.

The laser beam energy necessary for dividing the semiconductor layer or changing it to amorphous is smaller than that necessary for disconnecting the metal layer by fusion. For this reason, even when the insulating layer 26b is irradiated with the laser beam for a longer time, short circuit between the drain electrode 23 and the cathode 28 or breaking of the cathode 28 can be prevented. Hence, when the semiconductor layer is divided or converted into amorphous instead of disconnecting the metal layer by fusion, power supply to the organic EL element 30 can more easily be reduced.

An example of laser beam irradiation conditions capable of preventing breaking of the cathode 28 will be described below.

Figure 12:
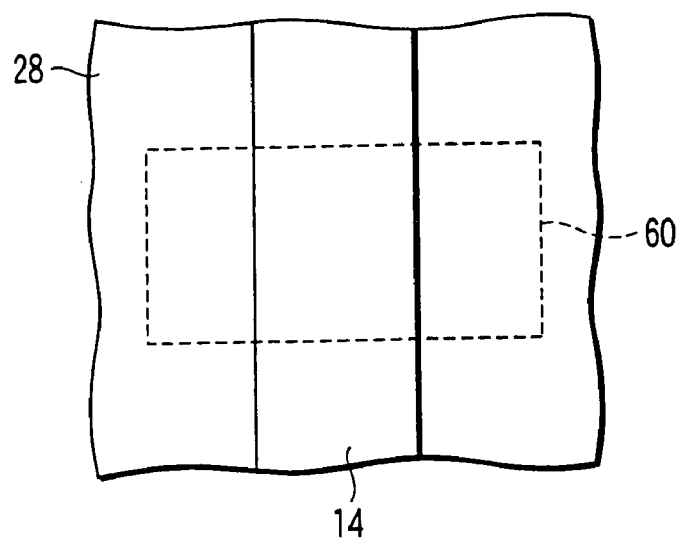
FIG. 12 is a plan view schematically showing part of an organic EL display used in a laser beam irradiation test.

FIG. 12 is a plan view schematically showing part of an organic EL display used in a laser beam irradiation test. FIG. 12 is an enlarged view of part of a structure which can be observed when the organic EL display 1 having almost the same structure as that shown in FIG. 1 is viewed from the side of the substrate 11 and, more specifically, the polysilicon layer 14. The polysilicon layer 14 is located between the substrate 11 and the insulating layer 26b.

In this example, the width of the polysilicon layer 14 was 3 μm, and the thickness was 0.5 μm. The beam spot formed by a laser beam at a position on the surface of the polysilicon layer 14 was rectangular, and the size was 3 μm×6 μm.

Under these conditions, the polysilicon layer 14 was irradiated with a laser beam, and the states of the polysilicon layer 14 and cathode 28 and the enable/disable state of dark spot formation after laser beam irradiation were checked. The following table shows the result.

| Irradiation energy density (mJ/µm²) | State of polysilicon layer | State of cathode | Dark spot formation |
|---|---|---|---|
| 0.0167 | Not divided | ○ | Disable |
| 0.0250 | Not divided | □ | Disable |
| 0.0333 | Not divided | □ | Disable |
| 0.0417 | Divided | □ | Enable |
| 0.0833 | Divided | Δ | Enable |
| 0.1250 | Divided | Δ | Enable |
| 0.1667 | Divided | Δ | Enable |

In the above table, "state of polysilicon layer" indicates the state of the polysilicon layer 14 after laser beam irradiation, which was observed by a microscope. "○" indicates that the cathode 28 was not influenced by laser beam irradiation. "□" indicates that a hole was formed in the cathode 28 at a position corresponding to the non-overlap portion of the beam spot 60 which did not overlap the polysilicon layer 14. "Δ" indicates that a hole was formed in the cathode 28 at the entire position corresponding to the beam spot 60.

In the above example, when the irradiation energy density was larger than 0.0333 mJ/µm², the pixel 31 could be changed to a dark spot pixel. In this example, when the irradiation energy density was smaller than 0.0833 mJ/µm², no hole was formed in the cathode 28 at the position corresponding to the overlap portion of the beam spot 60 which overlapped the polysilicon layer 14.

A volume V of the overlap portion of the polysilicon layer 14 which overlaps the beam spot 60 is 3 µm×3 µm×0.5 µm=4.5 µm³. Hence, when the size of the beam spot 60 coincides with the width of the polysilicon layer 14 while the volume V (µm³) and an irradiation energy R (mJ) satisfy the relationship represented by the inequality:

$$0.067 \times V < R < 0.17 \times V$$

the pixel 31 can be changed to a dark spot pixel without forming a hole in the cathode 28.

The third embodiment of the present invention will be described next. In the first and second embodiments, laser beam irradiation is executed for a portion located between the insulating layer 26b of the pixel circuit and the insulating substrate 11. In the third embodiment, a planarizing layer made of an organic insulating material is formed as an underlayer of an anode 25. Laser beam irradiation is done for a layer located between the planarizing layer of the pixel circuit and an insulating substrate 11.

Figure 13:
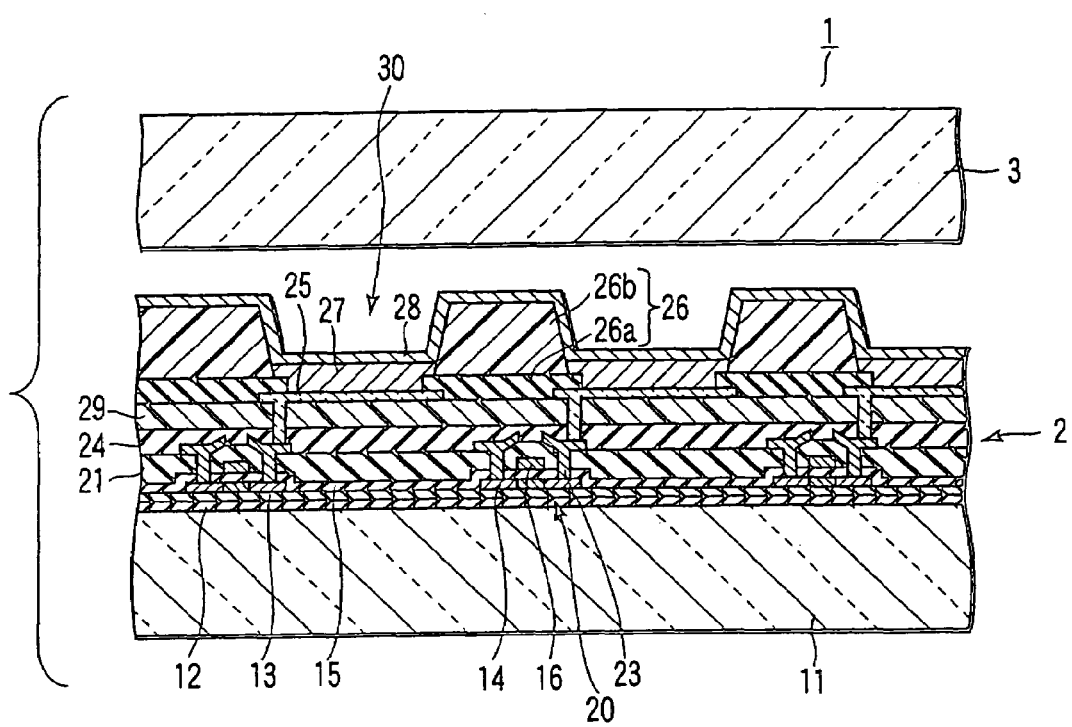
FIG. 13 is a sectional view schematically showing an organic EL display according to the third embodiment of the present invention.

FIG. 13 is a sectional view schematically showing an organic EL display according to the third embodiment of the present invention. An organic EL display 1 has the same structure as that of the organic EL display 1 shown in FIG. 1 except that a planarizing layer 29 made of an organic insulating material is formed between a passivation film 24 and the anode 25 and insulating layer 26a.

Many of organic insulating materials such as acrylic resin used for the planarizing layer 29 absorb a laser beam used to divide the semiconductor layer or change it to amorphous or a laser beam used to fuse a metal layer at a high efficiency. For this reason, when a semiconductor layer or metal layer to be irradiated with a laser beam is present between the substrate 11 and the planarizing layer 29, the planarizing layer 29 can be used for the same purpose as described in association with the insulating layer 26b in the second embodiment. More specifically, where the same laser beam irradiation as described in the second embodiment is done for a layer on the lower side of the planarizing layer 29, the processing can be carried out without causing any short-circuit between electrodes or breaking of a cathode 28.

In this embodiment, the above-described laser beam irradiation is preferably executed for the overlap portion of the planarizing layer 29 which overlaps the insulating layer 26b. In this case, both the planarizing layer 29 and insulating layer 26b can absorb the laser beam.

In the above-described first to third embodiments, the anode 25 is formed on the passivation film 24. However, the anode 25 may be formed on the interlayer insulator 21. That is, the video signal line 42 and anode 25 may be formed on the same plane. In the above embodiments, the organic EL display 1 is of bottom emission type. In other words, the display surface is arranged on the side of the array substrate on which the elements are formed. Alternatively, the organic EL display may be of top emission type. In other words, the display surface may be arranged on the counter substrate side. When the organic EL display is of bottom emission type, the process work can be done after module assembly. When the array substrate 2 is sealed by the counter substrate 3 while encapsulating a drying agent in the space between the substrates, the service life of elements can be prolonged. Alternatively, when the space between the counter substrate 3 and the array substrate 2 is filled with a resin, the heat dissipation characteristic can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an organic EL display, comprising:
   providing a structure including an insulating substrate with light transmittance properties and a plurality of pixels arrayed in a matrix above the insulating substrate, each pixel having an organic EL element which is configured to emit light and a drive transistor which is configured to supply a current from a power supply terminal to the organic EL element and includes a gate electrode formed on a gate insulator and a semiconductor layer formed under the gate insulator, parts of the semiconductor layer being used as source and drain regions;
   selecting a pixel which can be recognized as a dark spot and/or a bright spot from the pixels; and
   irradiating a portion of the semiconductor layer included in the selected pixel with an energy beam through the insulating substrate to electrically disconnect the organic EL element included in the selected pixel from the power supply terminal.

2. A method according to claim 1, wherein the structure further includes a partition insulating layer which is adjacent to the organic EL element above the insulating layer, and
   wherein the portion of the semiconductor layer included in the selected pixel and irradiated with the energy beam is located between the partition insulating layer and the insulating substrate.

3. A method according to claim 1, wherein the energy beam irradiation is carried out such that a volume V (µm³) of the portion of the semiconductor layer which is irradiated with the energy beam and an energy R (mJ) of the energy beam with which the portion of the semiconductor layer is irradiated satisfy a relationship given by an inequality:

$$0.067 \times V < R < 0.17 \times V.$$

4. A method according to claim 1, wherein the semiconductor layer is made of polysilicon.

5. A method according to claim 1, wherein the energy beam irradiation divides the semiconductor layer included in the selected pixel.

6. A method according to claim 1, wherein irradiating the portion of the semiconductor layer with the energy beam includes changing the portion of the semiconductor layer irradiated with the energy beam from polysilicon to amorphous silicon.

7. A method according to claim 1, wherein the structure further includes a partition insulating layer which is adjacent to the organic EL element above the insulating substrate and includes an organic insulating layer, and wherein the portion of the semiconductor layer included in the selected pixel and irradiated with the energy beam is located between the partition insulating layer and the insulating substrate.

8. A method according to claim 1, wherein the structure further includes an organic insulating film between the organic EL element and the drive transistor.

9. A method of manufacturing an organic EL display, comprising:

providing a structure including an insulating substrate with light transmittance properties and a plurality of pixels arrayed in a matrix above the insulating substrate, each pixel having an organic EL element which is configured to emit light, a drive transistor which is configured to supply a current from a power supply terminal to the organic EL element, and an interconnection which electrically connects the organic EL element through the drive transistor to the power supply terminal and includes a semiconductor layer doped with an impurity;

selecting a pixel which can be recognized as a dark spot and/or a bright spot from the pixels; and irradiating a portion of the semiconductor layer included in the selected pixel with an energy beam through the insulating substrate to at least partially disconnect the organic EL element included in the selected pixel from the power supply terminal.

10. A method according to claim 9, wherein the structure further includes a partition insulating layer which is adjacent to the organic EL element above the insulating layer, and wherein the portion of the semiconductor layer included in the selected pixel and irradiated with the energy beam is located between the partition insulating layer and the insulating substrate.

11. A method according to claim 9, wherein the energy beam irradiation is carried out such that a volume V ($\mu m^3$) of the portion of the semiconductor layer which is irradiated with the energy beam and an energy R (mJ) of the energy beam with which the portion of the semiconductor layer is irradiated satisfy a relationship given by an inequality:

$$0.067 \times V < R < 0.17 \times V.$$

12. A method according to claim 9, wherein the semiconductor layer is made of polysilicon.

13. A method according to claim 9, wherein the energy beam irradiation divides the semiconductor layer included in the selected pixel.

14. A method according to claim 9, wherein irradiating the portion of the semiconductor layer with the energy beam includes changing the portion of the semiconductor layer irradiated with the energy beam from polysilicon to amorphous silicon.

15. A method according to claim 9, wherein the structure further includes a partition insulating layer which is adjacent to the organic EL element above the insulating substrate and includes an organic insulating layer, and wherein the portion of the semiconductor layer included in the selected pixel and irradiated with the energy beam is located between the partition insulating layer and the insulating substrate.

16. A method according to claim 9, wherein the structure further includes an organic insulating film between the organic EL element and the drive transistor.

17. A method according to claim 9, wherein the energy beam irradiation electrically disconnects the organic EL element included in the selected pixel completely from the power supply terminal.

18. A method according to claim 9, wherein the organic EL element in each of the pixels comprises:

a plurality of anodes which are spaced apart from each other and electrically connected through the transistor to the power supply terminal; and a cathode which faces the anodes, and an organic layer which is interposed between the anodes and the cathode and includes a light emitting layer, wherein the energy beam irradiation electrically disconnects one of the anodes included in the selected pixel from the power supply terminal.

19. A method according to claim 18, wherein the interconnection in each of the pixels includes an end which, is branched to form branch portions, each of the branch portions including a portion of the semiconductor layer, and the branch portions being electrically connected to the anodes, respectively, and wherein one of the branch portions included in the selected pixel is irradiated with the energy beam.

* * * * *